United States Patent [19]
Hikita et al.

[11] Patent Number: 5,198,675
[45] Date of Patent: Mar. 30, 1993

[54] BACKSCATTERED ELECTRON DETECTOR FOR AN ELECTRON BEAM APPARATUS

[75] Inventors: Kikuhiro Hikita, Atsugi; Jiro Toumatsu, Isehara; Shoji Shimakura, Yokohama, all of Japan

[73] Assignee: Kabushiki Kaisha Topcon, Tokyo, Japan

[21] Appl. No.: 800,570

[22] Filed: Nov. 27, 1991

[30] Foreign Application Priority Data

Nov. 30, 1990 [JP] Japan .................. 2-333696

[51] Int. Cl.$^5$ .......................................... H01J 37/244
[52] U.S. Cl. ...................... 250/397; 250/310
[58] Field of Search ........... 250/397, 310, 361 R, 250/363.01, 367

[56] References Cited

U.S. PATENT DOCUMENTS

| | | | |
|---|---|---|---|
| 3,319,065 | 5/1967 | Webster et al. | 250/363.01 |
| 4,177,379 | 12/1979 | Furukawa et al. | 250/397 |
| 4,217,495 | 8/1980 | Robinson | 250/310 |
| 4,559,450 | 12/1985 | Robinson et al. | 250/310 |
| 4,700,075 | 10/1987 | Kurz et al. | 250/310 |
| 5,043,583 | 8/1991 | Robinson | 250/397 |

Primary Examiner—Jack I. Berman
Assistant Examiner—Kiet T. Nguyen
Attorney, Agent, or Firm—Haynes and Boone

[57] ABSTRACT

In a backscattered electron detector for an electron beam apparatus which consists of scintillators, a photomultiplier and an amplifier, a plurality of scintillators are disposed in a specimen chamber between an objective lens and a specimen and are arranged close together with their ends facing each other. The scintillators are formed with a notch at the facing ends so that a gap or opening is formed by the opposing notches to allow an electron beam to pass through the scintillators. Since each scintillator has no end portion beyond a hole, which is found in the conventional backscattered electron detector and whose electron sensing portion has low detection efficiency, backscattered electrons released from the specimen are collected by an electron sensing portion on the scintillator that is not interrupted by the hole and which thus has a high detection efficiency. This enhances the detection efficiency of the back-scattered electron detector.

8 Claims, 3 Drawing Sheets

BACKSCATTERED ELECTRON DETECTOR FOR AN ELECTRON BEAM APPARATUS

BACKGROUND OF THE INVENTION

1. Field of the Invention

The present invention relates to an electron detector for efficiently detecting backscattered electrons in electron beam apparatuses such as electron microscopes.

2. Prior Art

Backscattered electron detectors used in electron beam apparatuses such as electron microscopes are available in two types: one using semiconductors and one using scintillators. An example of the backscattered electron detector of the scintillator type is shown in FIG. 1.

In the backscattered electron detector shown in FIG. 1, an objective lens 2 is disposed in the upper part of a specimen chamber 1 of an electron microscope. A focused electron beam 3 passing through the objective lens 2 is radiated against a specimen 4. Backscattered electrons 5 released from the specimen 4 strike an electron sensing portion 7 of a scintillator 6 coated with phosphor which emits light. The light thus emitted is detected by a backscattered electron detector 10 made up of a photomultiplier 8 and an amplifier 9.

Such a conventional scintillator 6, however, has the following drawback. The electron beam 3 that passes through a hole 6a formed in the scintillator 6, as shown in FIG. 2, irradiates the specimen 4, and the resulting backscattered electrons 5 strike the scintillator 6. Those backscattered electrons impinging on a scintillator base side 7a of the electron sensing portion 7 with respect to the hole 6a are collected and detected by the electron detector 10 with high efficiency. But light produced by those electrons that impinge on a scintillator end side 7b of the electron sensing portion 7 is reflected or scattered by the surface of the hole 6a and does not reach the photomultiplier 8, failing to be detected.

Since not whole area of the sensing portion 7 of the scintillator 6 can effectively arrest and detect the backscattered electrons 5 but only the scintillator base side 7a of the electron sensing portion 7 with respect to the hole 6a effectively captures the backscattered electrons, the overall detecting efficiency of the scintillator 6 is low and a significant improvement in the detection efficiency cannot be expected.

SUMMARY OF THE INVENTION

A primary object of this invention is to provide a backscattered electron detector for electron beam apparatuses that can enhance the detection capability of the scintillator and thereby improve the detector's overall efficiency in detecting backscattered electrons.

A second object of the invention is to provide a backscattered electron detector for electron beam apparatuses which has an improved sensitivity.

To achieve the above objective, in a backscattered electron detector for electron beam apparatuses which consists of scintillators, a photomultiplier, and an amplifier, a plurality of scintillators are kept close to or in contact with each other and disposed at a vertical level between the object lens and the specimen, and a notch for passing the electron beam is formed at the facing end of each of the closely arranged scintillators.

Since the plurality of scintillators, which are arranged close together with the ends facing each other, have no aperture in an intermediate part thereof but instead have a notch formed at each of the facing ends thereof, all the electron sensing portions on the scintillators that exit between the objective lens and the specimen are identical to the scintillator base side of the conventional electron sensing portion with an aperture which can directly capture the backscattered electrons with high efficiency.

Furthermore, since the electron beam passing notch is formed at the facing end of each closely arranged scintillator, these notches form an opening or hole through which the electron beam can pass even when the scintillators are arranged very close together or in contact with each other.

This construction eliminates that part of the electron sensing portion whose electron-converted light is reflected or scattered by the surface of the hole 6a. Therefore, the backscattered electrons are directly detected by only those electron sensing portions that have high detection efficiencies, enhancing the overall detection efficiency of the backscattered electron detector. Also, the provision of multiple scintillators multiplies the detection output of the backscattered electrons by the number of scintillators, improving the sensitivity of the backscattered electron detector.

Detailed objects and features of this invention will become apparent from the following description of an embodiment taken in conjunction with the attached drawings.

DETAILED DESCRIPTION OF THE PREFERRED EMBODIMENTS

Now, embodiments of this invention will be described by referring to the accompanying drawings.

Figure 1:
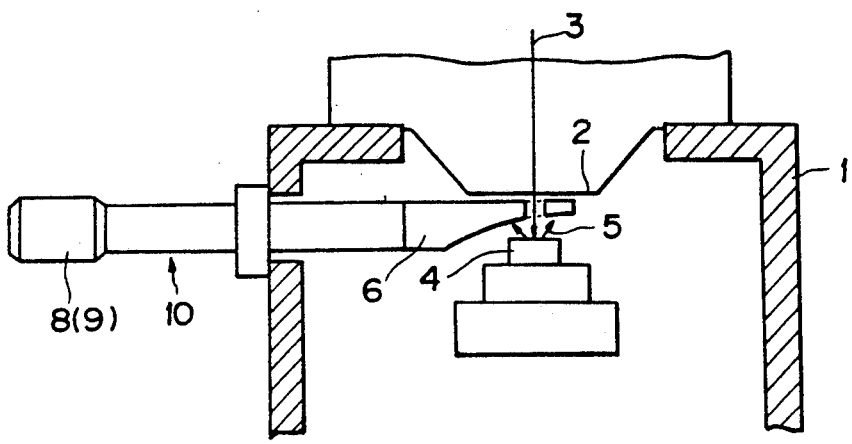
FIG. 1 is a side cross section showing a conventional backscattered electron detector for an electron beam apparatus installed in a specimen chamber.
Figure 2:
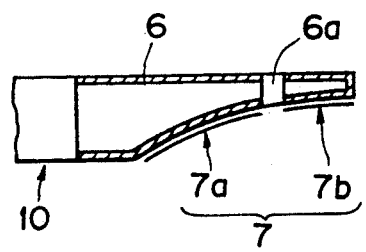
FIG. 2 is a longitudinal cross section of a scintillator of the conventional backscattered electron detector.
Figure 3:
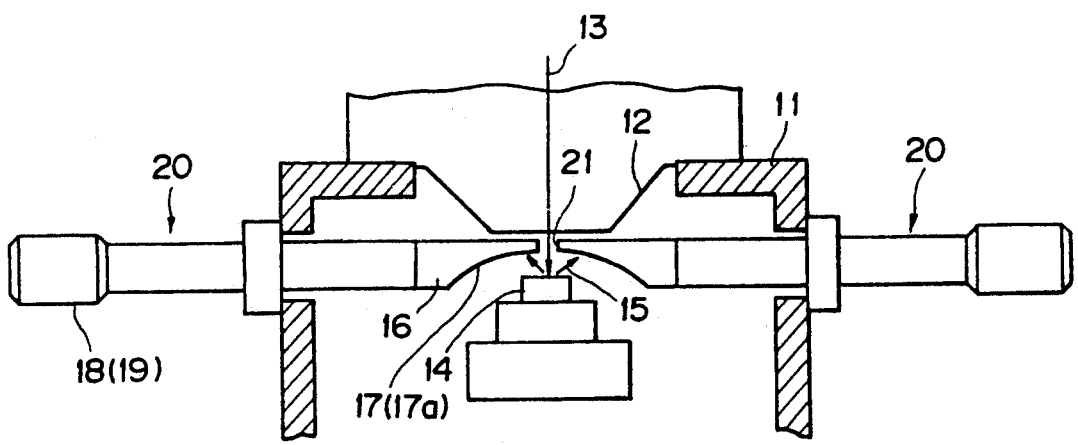
FIG. 3 is a side cross section showing a backscattered electron detector for an electron beam apparatus as one embodiment of the invention.
Figure 4:
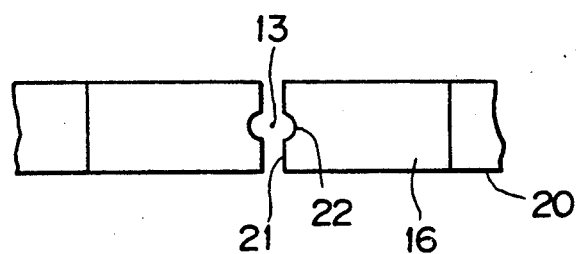
FIG. 4 is a plan view showing scintillators used in the backscattered electron detector of FIG. 3.

FIG. 3 shows a first embodiment of this invention, which, as in the prior art, has an objective lens 12 located in the upper part of a specimen chamber 11 of the electron microscope. An electron beam 13 passing through the objective lens 12 irradiates a specimen 14 and the resulting backscattered electrons 15 released from the specimen 14 impinge on an electron sensing portion 17 of a plastic scintillator 16, which in turn emits light. The emitted light is then detected by a backscattered electron detector 20 made up of a photomultiplier 18 and an amplifier 19. Two plastic scintillators 16 are held at a vertical level between the objective lens 12 and the specimen 14, and are also arranged symmetrical about the axis of the electron beam 13 with their facing ends put close to each other, as shown in FIG. 4.

The plastic scintillators 16 have notch 22 formed at the center of the facing ends 21 to allow the electron beam 13 to pass through the scintillators. The provision of the notches 22 ensures that the electron beam can pass through the scintillators 16 even when they are put close together. These scintillators 16 may be placed in contact with each other, in which case an opening is formed at the contact portion by the opposing notches 22.

Figure 5:
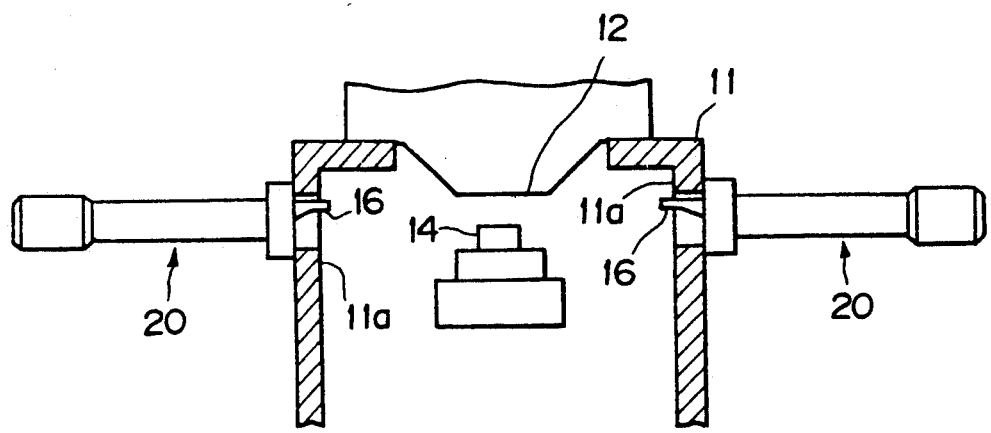
FIG. 5 is a side cross section of the backscattered electron detector of FIG. 3 with the scintillators shown retracted.

When the backscattered electron detector 20 is not in use, it can be retracted into the wall of the specimen chamber 11. As shown in FIG. 5, the scintillators 16 can be moved near the inner wall 11a of the specimen chamber 11. If some of the multiple electron detectors 20 are arranged between the objective lens 12 and the specimen 14 with the remaining electron detectors moved close to the inner wall 11a, it is possible not only to perform simultaneous detection with an X-ray detector and a cathode luminescence detector but also to tilt the specimen, which is put close to the detectors, at large angles.

By changing the gap between the two backscattered electron detectors 20, it is possible to change to a desired value the emission angle of the backscattered electrons to be detected.

The electron sensing portion 17 of the scintillator 16 where the backscattered electrons strike is curved downwardly concave so as to enclose the specimen and thereby prevent the electrons from escaping. This improves the detection efficiency and also makes it possible to detect backscattered electrons effectively even when the specimen 14 is inclined.

When compared with the conventional backscattered electron detector, the electron sensing portion 17 used in the electron detector 20 of the above embodiment is equivalent tot he scintillator base side 7a of the electron sensing portion 7 with respect to the hole 6a. And there is no electron sensing portion in this embodiment that corresponds to the scintillator end side 7b of the electron sensing portion 7 with respect to the hole 6a whose electron-converted light is reflected or scattered by the surface of the hole 6a and does not reach the photomultiplier 8. Therefore, the backscattered electron detectors of this embodiment have only the electron sensing portions 17 that permit direct detection by the detector 20 of backscattered electrons with high efficiencies. Further, since the notches 22 are formed at the center of the facing ends 21 of the scintillators 16, it is understood that even when the two plastic scintillators 16 come into contact at the ends, the electron beam can pass through the scintillators because the opposing notches 22 form an opening for the electron beam to pass through.

Figure 6:
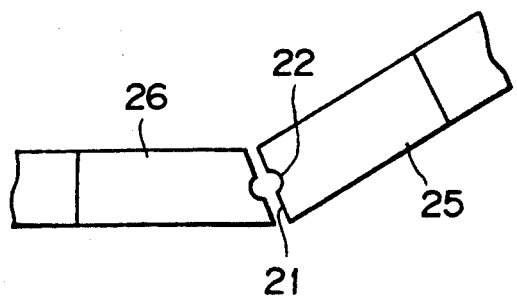
FIG. 6 is a plan view of scintillators used in a second embodiment of the invention.

While the above first embodiment is shown to have two electron detectors 20 disposed symmetrical about the electron beam axis, the center lines of the two backscattered electron detectors 25, 26 may not necessarily be aligned, as shown in a second embodiment of FIG. 6.

Figure 7:
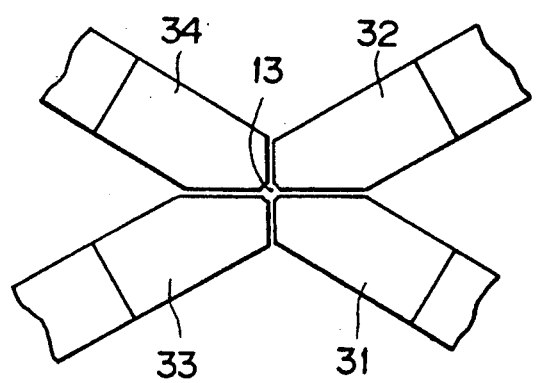
FIG. 7 is a plan view of scintillators used in a third embodiment of the invention.

Further, three or more backscattered electron detectors 20 may be provided. For example, like a third embodiment shown in FIG. 7, four backscattered electron detectors 31, 32, 33, 34 may be arranged close together with the ends facing one another so that the center of the four detectors is located at the pathway of the electron beam 13.

Although the above embodiments are shown to use plastic scintillators, it is possible to use scintillators made of glass or of a composite material of plastic and glass.

Figure 8:
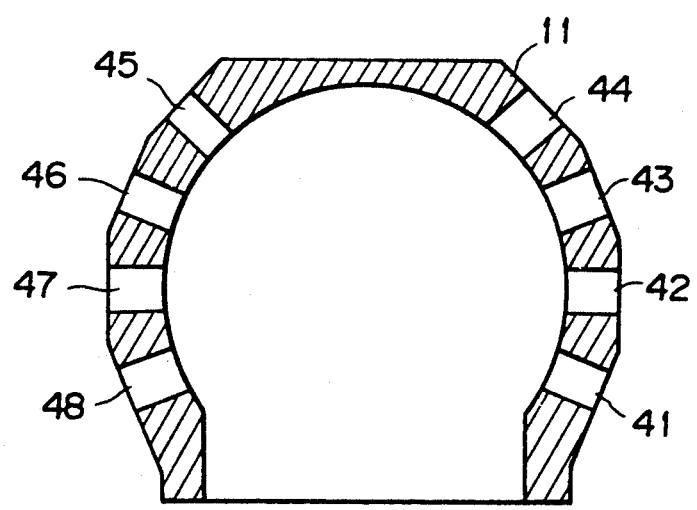
FIG. 8 is a horizontal cross section of a specimen chamber used in the electron beam apparatus which incorporates the backscattered electron detector of the invention, showing the portion cut by a plane between the objective lens and the specimen.

FIG. 8 shows a cross section of the specimen chamber 11 cut along a horizontal plane between the objective lens 12 and the specimen 14. This specimen chamber 11 has many ports to which the backscattered electron detectors are mounted. Any of these ports can be used. The second embodiment of FIG. 6 has the detectors 25, 26 mounted to the port 43 and port 47 while the third embodiment of FIG. 7 has the ports 41, 43, 46, 48 installed with four backscattered electron detectors 31, 32, 33, 34.

We claim:

1. A backscattered electron detector for an electron beam apparatus comprising:
    a photomultiplier;
    an amplifier; and
    a plurality of scintillators disposed in a specimen chamber between an objective lens and a specimen in such a way that they are close to or in contact with each other, said scintillators each having a notch formed at closely disposed, facing end portions.

2. A backscattered electron detector for an electron beam apparatus as claimed in claim 1, wherein said plurality of scintillators are arranged in a straight line.

3. A backscattered electron detector for an electron beam apparatus as claimed in claim 1, wherein said plurality of scintillators are arranged at angles.

4. A backscattered electron detector for an electron beam apparatus as claimed in claim 1, wherein three or more scintillators are arranged radially.

5. A backscattered electron detector for an electron beam apparatus as claimed in claim 1, wherein the side wall of said specimen chamber is formed with a plurality of ports and said scintillators are mounted to any selected ports.

6. A backscattered electron detector for an electron beam apparatus as claimed in claim 5, wherein said scintillators are mounted to the ports in the specimen chamber so that they can be advanced into or retracted from the specimen chamber through the ports.

7. A backscattered electron detector for an electron beam apparatus as claimed in claim 1, wherein said scintillators each have an electron sensing portion whose surface is curved downwardly concave so as to enclose the specimen in the specimen chamber.

8. A backscattered electron detector for an electron beam apparatus comprising:
    a photomultiplier;
    an amplifier; and
    a plurality of scintillators disposed in a specimen chamber between an objective lens and a specimen so that they face each other, the facing portions of said scintillators defining an opening for the passage of an electron beam from said lens to said specimen, said scintillators being able to be advanced into or retracted from the specimen chamber.

* * * * *